United States Patent
Chen et al.

(10) Patent No.: US 8,928,372 B2
(45) Date of Patent: Jan. 6, 2015

(54) MULTIPLE POWER DOMAIN ELECTRONIC DEVICE AND RELATED METHOD

(71) Applicant: Taiwan Semiconductor Manufacturing Company, Ltd., Hsin-Chu (TW)

(72) Inventors: Jerry Chen, New Taipei (TW); Hsu-Shun Chen, Toufen Town (TW); Gu-Huan Li, Zhubei (TW); Cheng-Hsiung Kuo, Jubei (TW); Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,155

(22) Filed: Mar. 8, 2013

(65) Prior Publication Data

US 2014/0253190 A1 Sep. 11, 2014

(51) Int. Cl.
*H03L 7/00* (2006.01)
*H03K 17/22* (2006.01)

(52) U.S. Cl.
CPC ............................ *H03K 17/223* (2013.01)
USPC ...................... 327/143; 327/142; 327/198

(58) Field of Classification Search
USPC ............................... 327/142, 143, 198
See application file for complete search history.

(56) References Cited

U.S. PATENT DOCUMENTS

| | | | | |
|---|---|---|---|---|
| 6,556,478 | B2 * | 4/2003 | Willis et al. | 365/185.09 |
| 7,057,427 | B2 * | 6/2006 | Wadhwa et al. | 327/143 |
| 7,439,882 | B1 * | 10/2008 | Meeks | 341/59 |
| 8,610,472 | B2 * | 12/2013 | Kang | 327/143 |
| 2004/0217785 | A1 * | 11/2004 | Colbeck et al. | 327/142 |
| 2005/0134334 | A1 * | 6/2005 | Mikyska | 327/143 |
| 2010/0201410 | A1 * | 8/2010 | Illegems | 327/143 |
| 2011/0156769 | A1 * | 6/2011 | Kang | 327/143 |
| 2012/0242380 | A1 * | 9/2012 | Edwards | 327/143 |
| 2013/0021065 | A1 * | 1/2013 | Kang | 327/52 |
| 2014/0035634 | A1 * | 2/2014 | Shrivastava et al. | 327/143 |

* cited by examiner

*Primary Examiner* — Brandon S Cole
(74) *Attorney, Agent, or Firm* — Slater & Matsil, L.L.P.

(57) ABSTRACT

An electronic device includes a first circuit, a second circuit, and a power on control (POC) circuit. The POC circuit includes an enable terminal electrically connected to a first output of the first circuit, a first input terminal electrically connected to a first voltage supply, a second input terminal electrically connected to a second voltage supply, and an output terminal. The second circuit includes a biasing-sensitive circuit, and a logic circuit including a first input terminal electrically connected to a second output of the first circuit, a second input terminal electrically connected to the output of the POC circuit, and an output terminal electrically connected to an enable terminal of the biasing-sensitive circuit.

20 Claims, 6 Drawing Sheets

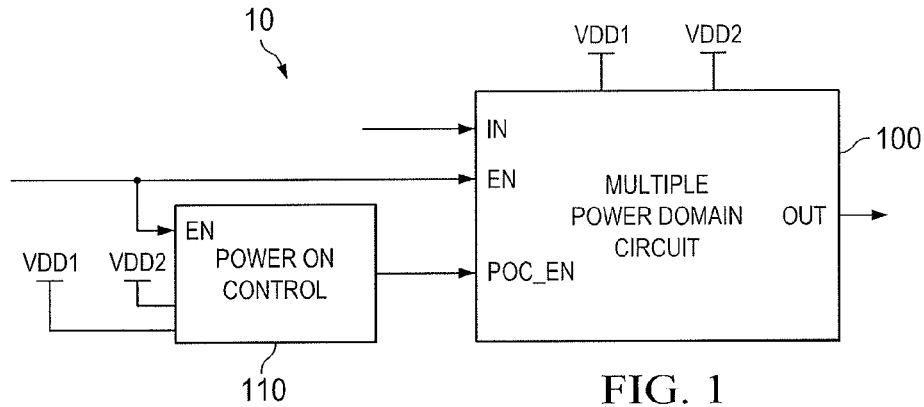
FIG. 1
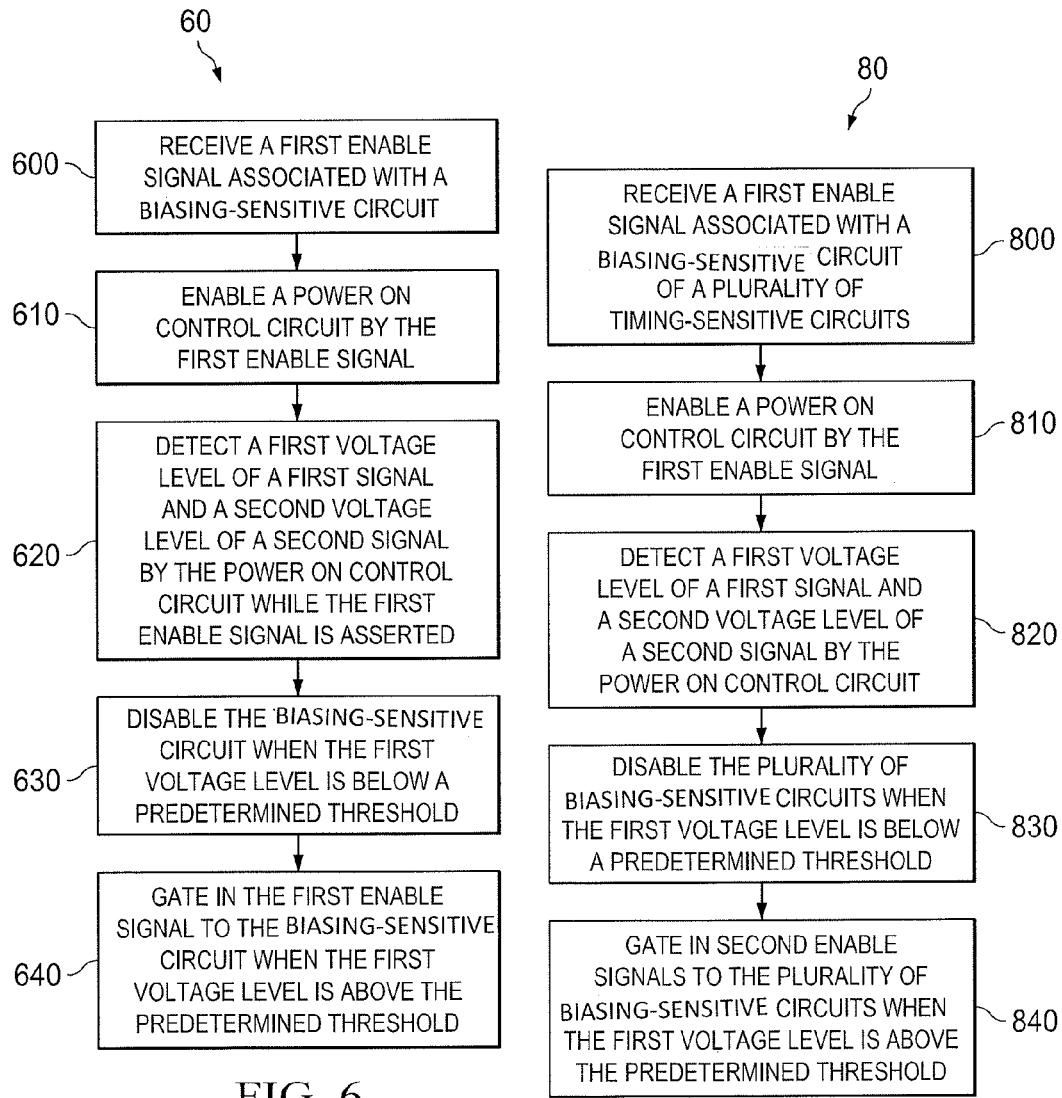
FIG. 6
FIG. 8

MULTIPLE POWER DOMAIN ELECTRONIC DEVICE AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with modern core device voltages trending toward less than 1 Volt, and input/output (I/O) device voltages under 2 Volts.

Non-volatile memory (NVM), a type of memory that retains stored data while not powered, is often embedded in complementary metal-oxide-semiconductor (CMOS) logic processes, and typically requires high voltage for programming, and low voltage for reading. Non-volatile memory is but one example of circuits that operate in multiple power domains. Power on control (POC) circuits are often used to ensure proper operation of circuitry in the multiple power domain environment.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 is a circuit diagram of an electronic device in accordance with various embodiments of the present disclosure;

FIG. 6 is a flowchart showing a method of operating an electronic device in accordance with various embodiments of the present disclosure;

FIG. 8 is a flowchart showing a method of operating an electronic device in accordance with various embodiments of the present disclosure.

DETAILED DESCRIPTION OF ILLUSTRATIVE EMBODIMENTS

Figure 2:
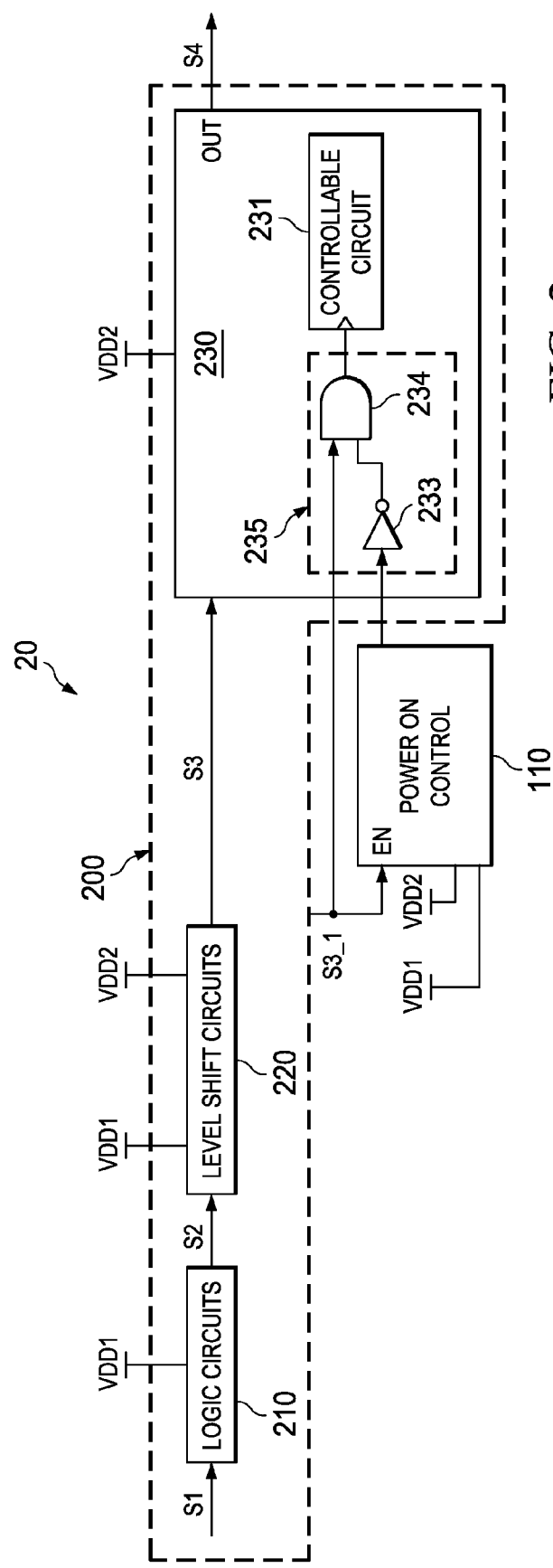
FIG. 2 is a detailed diagram of an electronic device in accordance with various embodiments of the present disclosure.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a multiple power domain circuit, and the like. Other embodiments may also be applied, however, to other types of memory circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Non-volatile memory circuits, which include flash, floating gate, magnetic, and resistive types, among others, are designed to store data by assuming a state (e.g., a certain electric charge) that is not affected by loss of power to the non-volatile memory circuit. In many applications, decoder logic uses low voltage(s) to select a non-volatile memory cell for programming, while a word line driver drives high voltage on a word line to program the non-volatile memory cell. Application of the high and low voltages to the non-volatile memory cell is controlled properly to prevent unintentional writing of some cells while allowing writing of an intended cell(s). To prevent unintentional write, other approaches utilize a power on control (POC) circuit designed to gate large power switches. These other approaches incur standby power consumption and an area penalty due to large power switch design.

In the following disclosure, an electronic device architecture employing a novel power on control (POC) circuit is introduced. The POC circuit is enabled to detect a first voltage only when an enable signal corresponding to a sensitive circuit is asserted, and the POC circuit disables the sensitive circuits directly. The POC circuit is disabled when the enable signal is dis-asserted, so that standby current of the POC circuit is substantially zero when the enable signal is not asserted. The electronic device architecture using the POC circuit is readily configurable to many applications that require different voltage inputs to prevent unintentional enabling of biasing-sensitive circuits.

FIG. 1 is a circuit diagram of an electronic device 10 in accordance with various embodiments of the present disclosure. A multiple power domain circuit 100 of the electronic device 10 is electrically connected to a first voltage supply and a second voltage supply. The first voltage supply normally provides electrical power at a first voltage VDD1. The second voltage supply normally provides electrical power at a second voltage VDD2. The first voltage VDD1 is different from the second voltage VDD2. In some embodiments, the first voltage VDD1 is lower in magnitude than the second voltage VDD2. For example, the first voltage VDD1 may be about 1.8 Volts, and the second voltage VDD2 may be about 5.5 Volts. In some embodiments, the first voltage VDD1 is higher in magnitude than the second voltage VDD2.

The multiple power domain circuit 100 receives input signals at an input terminal(s) IN, and performs processing on the input signals to generate output signals at an output terminal(s) OUT. In some embodiments, the processing is analog processing, such as level shifting, filtering, amplifying, or the like. In some embodiments, the processing is digital processing, such as encoding, decoding, digital filtering, noise cancellation, edge recognition, or the like. In some embodiments, the processing is mixed-signal processing, such as digital-to-analog conversion, analog-to-digital conversion, filtering, or the like.

The multiple power domain circuit 100 is enabled and disabled by an enable signal received at an enable terminal EN of the multiple power domain circuit 100. In some embodiments, the enable signal is generated external to the multiple power domain circuit 100. In some embodiments, the enable signal is generated by at least one internal circuit of the multiple power domain circuit 100 for at least enabling or disabling at least one other internal circuit of the multiple power domain circuit 100. The multiple power domain circuit 100 is configured to operate in a first mode when the enable signal is asserted, and in a second mode when the enable signal is not asserted. For example, a first group of circuits of the multiple power domain circuit 100 may be disabled when the enable signal is not asserted, and the first group of circuits of the multiple power domain circuit 10 may be enabled when the enable signal is asserted. In some embodiments, enabling refers to powering on. In some embodiments, enabling refers to allowing signals to enter (e.g., by logic gating). In some embodiments, disabling refers to powering off. In some embodiments, disabling refers to disallowing signals from entering (e.g., by logic gating).

The multiple power domain circuit 100 is further enabled or disabled by a power on control (POC) enable signal received at a POC enable terminal POC_EN of the multiple power domain circuit 100. The POC enable signal is generated by a power on control (POC) circuit 110. In some embodiments, the disabling in response to the POC enable signal includes powering off biasing-sensitive circuits, for example. In some embodiments, the disabling in response to the POC enable signal includes blocking signal input to the biasing-sensitive circuits (e.g., by logic gating). In some embodiments, the enabling in response to the POC enable signal includes powering on the biasing-sensitive circuits. In some embodiments, the enabling in response to the POC enable signal includes allowing signal input to the biasing-sensitive circuits (e.g., by logic gating).

The POC circuit 110 is electrically connected to the first voltage supply and the second voltage supply. The POC circuit 110 detects voltage levels of the first voltage supply and the second voltage supply, and asserts the POC enable signal when both voltage supplies are ready (e.g., at sufficiently high voltage levels) for normal operation of the multiple power domain circuit 100. In some embodiments, the POC circuit 110 detects a first signal intended to have the first voltage, and a second signal intended to have the second voltage, and asserts the POC enable signal when both the first signal and the second signal are ready. In some embodiments, the POC circuit 110 is responsive to the enable signal. In some embodiments, the POC circuit 110 performs detection and assertion when the enable signal is asserted, and does not perform the detection and the assertion when the enable signal is not asserted.

FIG. 2 is a detailed diagram of an electronic device 20 in accordance with various embodiments of the present disclosure. In some embodiments, a multiple power domain circuit 200 of the electronic device 20 receives input control signals S1, and outputs output signals S4. Logic circuits 210 of the multiple power domain circuit 200 receive the input control signals S1, and perform logic operations on the input control signals to output first intermediate signals S2. Level shift circuits 220 of the multiple power domain circuit 200 receive the first intermediate signals S2, and perform level shifting on the first intermediate signals S2 to output second intermediate signals S3. A sensitive circuit 230 receives the second intermediate signals S3, and performs operations on the second intermediate signals S3 by a controllable circuit 231 to output the output signals S4.

The logic circuits 210 include logic gates, such as AND gates, NAND gates, OR gates, NOR gates, inverters, XOR gates, XNOR gates, or the like. In some embodiments, the logic circuits 210 perform decoding of the input control signals S1. For example, the input control signals S1 may be address signals for selecting the electronic device 20. In some embodiments, the logic circuits 210 are biased by the first voltage VDD1. In some embodiments, the logic circuits 210 include low threshold voltage $V_{TH}$ transistors.

The level shift circuits 220 include transistors, which are high threshold voltage $V_{TH}$ transistors in some embodiments. The level shift circuits 220 convert the first intermediate signals S2, which have the first voltage VDD1 in some embodiments, to the second intermediate signals S3, which have the second voltage VDD2 in some embodiments. For example, a cross-coupled inverter configuration may be used in the level shift circuits 220 to shift the first intermediate signals S2 that are in a range from about 0 Volts to about the first voltage VDD1 up to a range from about 0 Volts to about the second voltage VDD2. In some embodiments, an enable signal S3_1 inputted to the POC circuit 110 and the sensitive circuit 230 is one of the second intermediate signals S3 outputted by the level shift circuits 220. In some other embodiments, the enable signal S3_1 is generated by an internal circuit of the sensitive circuit 230.

In some embodiments, the sensitive circuit 230 is an analog circuit, a mixed-signal circuit, a digital circuit, a combination thereof, or the like. The sensitive circuit 230 is biased by the second voltage VDD2, and performs processing on the second intermediate signals S3 to generate the output signals S4. In some embodiments, the processing is analog processing, digital processing, mixed-signal processing, a combination thereof, or the like. In some embodiments, the controllable circuit 231 can cause errors when at least one of the first voltage VDD1 or the second voltage VDD2 is not ready. In some embodiments, not being ready means that a voltage (e.g., the first voltage VDD1 or the second voltage VDD2) is lower than a predetermined level of the voltage by a certain amount (e.g., a percentage, a real number of Volts, or the like). In some embodiments, the predetermined level is a rated level, a maximum level, a specified level, or the like. For example, the predetermined level of the first voltage VDD1 may be about 1.8 Volts, and the predetermined level of the second voltage VDD2 may be about 6 Volts. The certain amount may be 10%, 20%, 30%, or the like. The certain amount may be about 0.5 Volts, 1 Volt, 2 Volts, or the like. In some embodiments, the certain amount is the same for the first voltage VDD1 and the second voltage VDD2 (e.g., 30%). In some embodiments, the certain amount is different for the first voltage VDD1 and the second voltage VDD2 (e.g., 0.3 Volts for the first voltage VDD1, and 1 Volt for the second voltage VDD2). In some embodiments, the controllable circuit 231 can cause errors when the first voltage VDD1 is ready and the second voltage VDD2 is not ready. In some embodiments, the controllable circuit 231 can cause errors when the first voltage VDD1 is not ready and the second voltage VDD2 is ready. In some embodiments, the controllable circuit 231 can cause errors when the first voltage VDD1 is not ready and the second voltage VDD2 is not ready. In some embodiments, the controllable circuit 231 includes a first enabling circuit that enables the controllable circuit 231 when a logic high signal having the second voltage VDD2 (e.g., the enable signal S3_1 at about 6 Volts) biases an enable terminal of the controllable circuit 231.

To mitigate errors that may occur when at least one of the first voltage VDD1 or the second voltage VDD2 is not ready, a second enabling circuit 235 (or "pre-enabling circuit," "auxiliary enabling circuit") is included in the sensitive circuit 230 for allowing or blocking the enable signal S3_1. An inverter 233 of the second enabling circuit 235 receives the POC enable signal from the POC circuit 110, and inverts the POC enable signal to generate an inverted POC enable signal having voltage level logically different from voltage level of the POC enable signal. For example, when the POC enable signal is logic high, the inverted POC enable signal is logic low; when the POC enable signal is logic low, the inverted POC enable signal is logic high. In some embodiments, the POC enable signal is logic low when asserted, and logic high when not asserted.

A second logic gate 234 of the second enabling circuit 235 receives the enable signal S3_1 and the inverted POC enable signal, and outputs a timing sensitive enable signal to the controllable circuit 231. In some embodiments, the second logic gate 234 is an AND gate. In some embodiments, the second logic gate 231 is a NAND gate. When the enable signal S3_1 and the inverted POC enable signal are both logic high, the second logic gate 234 asserts the timing sensitive enable signal to enable the controllable circuit 231. When at least one of the enable signal S3_1 or the inverted POC enable signal is logic low, the second logic gate 234 does not assert the timing sensitive enable signal, thereby disabling the controllable circuit 231. In some embodiments, the inverter 233 is not included in the sensitive circuit 230. In some embodiments, the second enabling circuit 235 does not include logic gates, and uses other methods to disable the controllable circuit 231 (e.g., a switch for grounding the output terminal OUT of the sensitive circuit 230).

Figure 3:
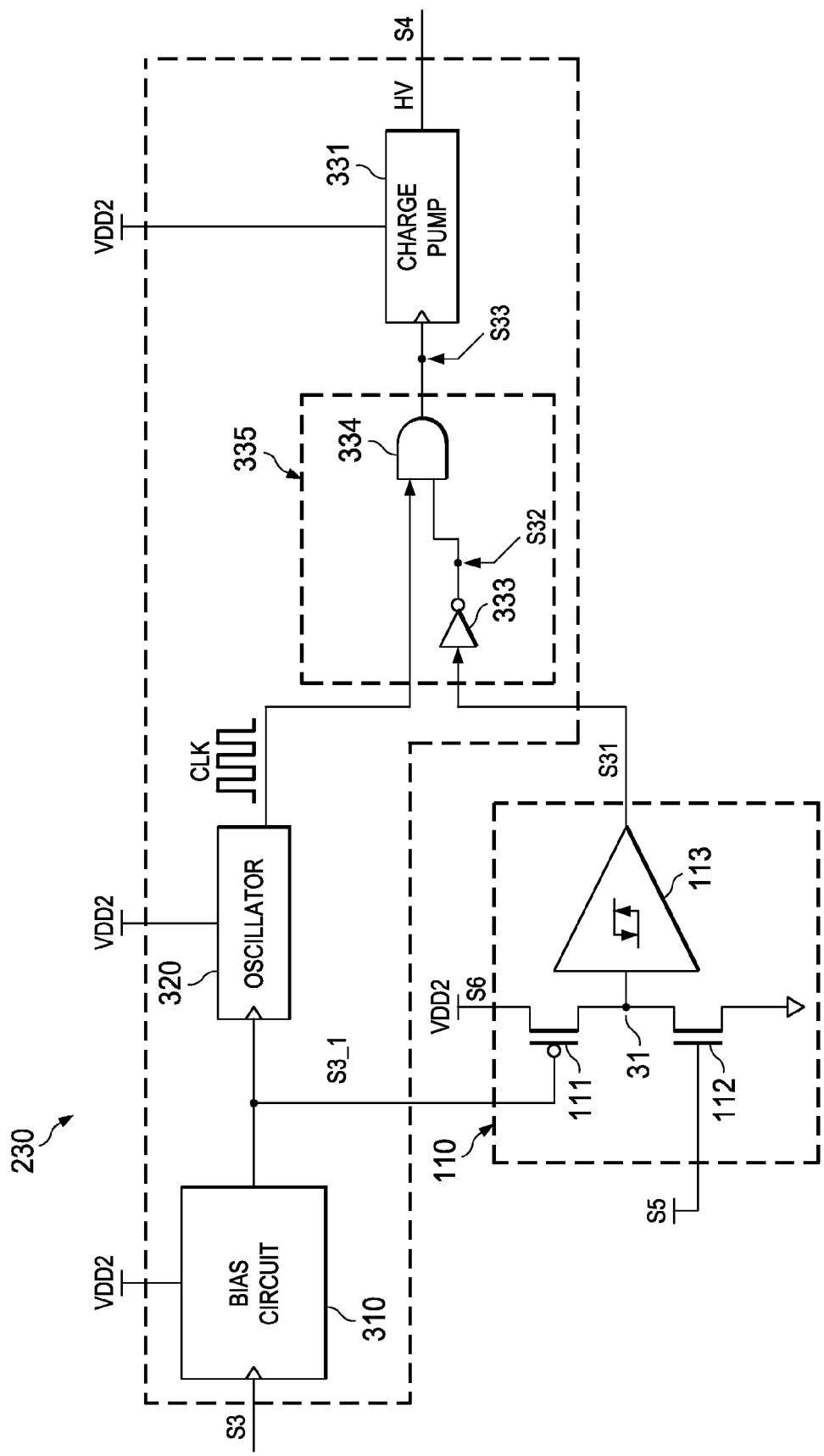
FIG. 3 is a detailed diagram of a sensitive circuit and a POC circuit in accordance with various embodiments of the present disclosure.

FIG. 3 is a detailed diagram of the sensitive circuit 230 and the POC circuit 110 in accordance with various embodiments of the present disclosure. In some embodiments, the sensitive circuit 230 is a high voltage generator circuit, which is applicable at least to programming of non-volatile memory (NVM) circuits. The sensitive circuit 230 includes at least a bias circuit 310, an oscillator 320, a charge pump 331, and the POC circuit 110. In some embodiments, the bias circuit 310, the oscillator 320, and the charge pump 331 are included in the sensitive circuit 230. The charge pump 331 is one example of the controllable circuit 231 of FIG. 2.

The bias circuit 310 receives input signals, such as the second intermediate signals S3, at an input terminal of the bias circuit 310. In some embodiments, the bias circuit 310 provides at least voltage bias or current bias to the oscillator 320 and the POC circuit 110. In some embodiments, the bias circuit 310 provides level shifting of the input signals. In some embodiments, the bias circuit 310 includes at least one current mirror.

The oscillator 320 is biased by the second voltage VDD2, and generates a clock signal CLK, which is also an enable signal, for driving the charge pump 331 to generate a high voltage (e.g., 10 Volts). In some embodiments, the oscillator 320 is a ring oscillator, a relaxation oscillator, an LC oscillator, a voltage-controlled oscillator, an injection locked oscillator, or the like. In some embodiments, the clock signal CLK is a periodic signal with a fixed frequency or a frequency set by a control signal, such as a voltage signal or current signal. In some embodiments, the clock signal CLK has voltage magnitude ranging from about 0 Volts to about the second voltage VDD2.

The charge pump 331 is enabled by the clock signal CLK. The clock signal CLK is allowed into or blocked from the charge pump 331 based on an output signal S31 of the POC circuit 110. In some embodiments, the output signal S31 is generated by a first transistor 111, a second transistor 112, and a Schmitt-trigger 113 of the POC circuit 110. A gate electrode of the first transistor 111 is electrically connected to an output terminal of the bias circuit 310 for receiving the enable signal S3_1. A gate electrode of the second transistor 112 receives a bias signal S5. In some embodiments, the bias signal S5 is in a range from about 0 Volts to about the first voltage V1. In some embodiments, the bias signal S5 tracks the first voltage VDD1. Based on the enable signal S3_1 and the bias signal S5, a node 31 corresponding to a drain electrode of the first transistor 111 and a drain electrode of the second transistor 112 is charged to the second voltage VDD2, or discharged to a low voltage (e.g., ground).

The Schmitt-trigger 113 of the POC circuit 110 receives voltage at the node 31 as an input, and outputs a POC enable signal S31 to a second enabling circuit 335 electrically connected to the charge pump 331 based on the voltage at the node 31. In some embodiments, when the voltage at the node 31 is above a first threshold of the Schmitt-trigger 113, the Schmitt-trigger 113 outputs a logic high voltage (e.g., the second voltage VDD2), and when the voltage at the node 31 is below a second threshold of the Schmitt-trigger 113, the Schmitt-trigger 113 outputs a logic low voltage (e.g., ground). In some embodiments, if output of the Schmitt-trigger 113 has the logic high voltage, the output of the Schmitt-trigger 113 will not flip to the logic low voltage until the voltage at the node 31 drops below the second threshold. In some embodiments, if the output of the Schmitt-trigger 113 has the logic low voltage, the output of the Schmitt-trigger 113 will not flip to the logic high voltage until the voltage at the node 31 rises above the first threshold. In some embodiments, a comparator replaces the Schmitt-trigger 113. In some embodiments, the comparator has two input terminals, one of which is biased at a reference voltage, and the other of which is biased by the voltage at the node 31. The Schmitt-trigger 113 may mitigate spurious drops in the voltage at the node 31 below the first threshold or spurious spikes in the voltage at the node 31 above the second threshold.

The POC enable signal S31 is asserted when the enable signal S3_1 has the logic low voltage, the second voltage supply S6 electrically connected to a source electrode of the transistor 111 is near the second voltage VDD2, and the bias signal S5 is near the first voltage VDD1. In some embodiments, the POC enable signal S31 has the logic low voltage when the POC enable signal S31 is asserted. The inverter 333 inverts logic level of the POC enable signal S31 to output a ready signal (the inverted POC enable signal) S32 having the logic high voltage to an AND gate 334 of the second enabling circuit 335. With one input of the AND gate 334 biased at the logic high voltage, the clock signal CLK at the other input of the AND gate 334 is gated in to the charge pump 331 as an input signal S33. The charge pump 331 outputs the high voltage based on the input signal S33 associated with the clock signal CLK.

Figure 4:
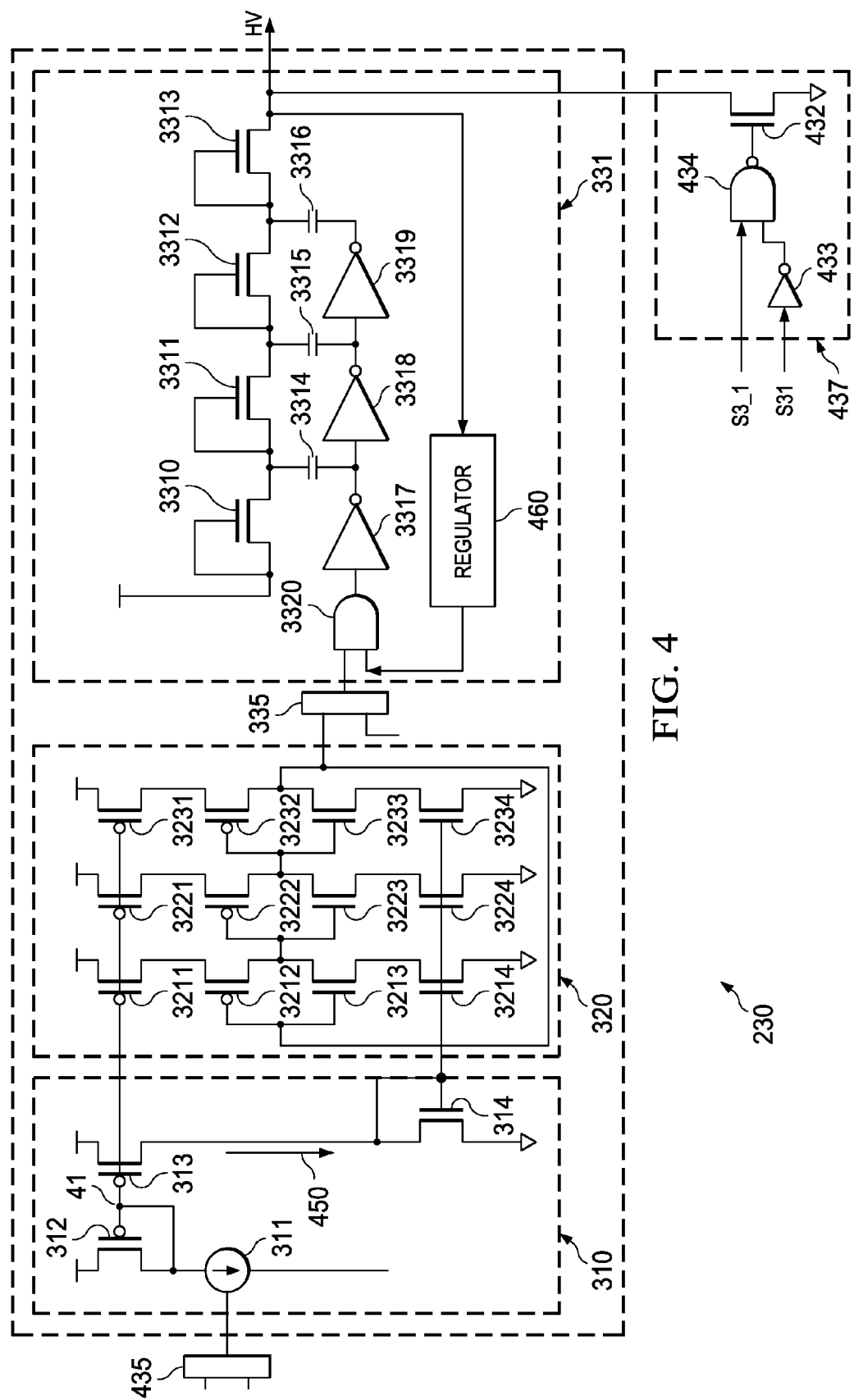
FIG. 4 is a detailed circuit schematic of the sensitive circuit shown in FIG. 3 in accordance with various embodiments of the present disclosure.

FIG. 4 is a detailed circuit schematic diagram of the sensitive circuit 230 shown in FIG. 3 in accordance with various embodiments of the present disclosure. A controllable current source 311 of the bias circuit 310 provides electrical current that is mirrored through transistors 312, 313, 314, generating a bias current 450. The electrical current is further mirrored through transistors 3211, 3221, 3231, 3214, 3224, 3234 to bias transistors 3212, 3222, 3232, 3213, 3223, 3233 of three inverters that make up a ring oscillator circuit of the oscillator 320. The oscillator 320 further includes biasing transistors 3211, 3221, 3231, 3214, 3224, 3234 for biasing the three inverters, respectively, and thereby controlling output frequency of the ring oscillator circuit. Output of the oscillator 320 (at drain electrodes of the transistors 3232, 3233) drives the charge pump 331. The charge pump 331, which is a Dickson-type charge pump in some embodiments, includes diode-connected transistors 3310-3313, capacitors 3314-3316, inverters 3317-3319, and logic gate 3320, configured as shown in FIG. 4. The charge pump 331 shown in FIG. 4 has three diode-capacitor stages (3310, 3314; 3311, 3315; and 3312, 3316), but other numbers of stages (e.g., 2, 4, 5 or more stages) are also contemplated herein. The logic gate 3320 is an AND gate in some embodiments.

A regulator 460 is electrically connected to form a feedback path from the output of the charge pump 331 (at the source terminal of the transistor 3313) to a first input terminal of the logic gate 3320. The regulator 460 is used for controlling high voltage output of the charge pump 331. In some applications, the charge pump 331 may output high voltage that exceeds a desired voltage output level for the charge pump 331. To achieve the desired voltage output level, the regulator 460 forms a negative feedback loop that detects the output level of the charge pump 331, and alters charge pump operation if the output level of the charge pump 331 exceeds the desired voltage output level. The regulator 460 may, for example, stop the clock signal CLK, turn off the oscillator 320, slow down the clock frequency of the clock signal CLK, or the like, to bring the high voltage output of the charge pump 331 down to the desired voltage output level.

In some situations, it is advantageous to disable high voltage output of the sensitive circuit 230, for example when circuit misoperation leads to at least one of the input control signal S1 or the first intermediate signal S2 being asserted mistakenly. As shown in FIG. 4, in some embodiments, the second enabling circuit 335, which has a first input terminal electrically connected to the output of the oscillator 320 (at the drain electrodes of the transistors 3232, 3233), and an output terminal electrically connected to a second input terminal of the logic gate 3320, is used for gating input to the charge pump 331 from the oscillator 320. The second enabling circuit 335 is shown in FIG. 3, and described above.

In some embodiments, a second enabling circuit 435 similar to the second enabling circuit 235 of FIG. 2 and the second enabling circuit 335 of FIG. 3 is electrically connected to the current source 311. An output terminal of the second enabling circuit 435 is electrically connected to a control terminal of the current source 311. In some embodiments, the current source 311 is or includes a MOSFET, and the control terminal is a gate electrode of the MOSFET. When the current source 311 is disabled by the second enabling circuit 435 (corresponding to the bias signal S5 being near the first voltage VDD1), voltage at a node 41 corresponding to gate electrodes of the transistors 313, 3211, 3221, 3231 is too high to turn on the transistors 313, 3211, 3221, 3231, and the current 450 is approximately zero. With no current flowing to the ring oscillator circuit of the oscillator 320, the oscillator 320 is turned off, and does not output a periodic signal to the logic gate 3320. As a result, the charge pump 331 is effectively disabled.

In some embodiments, a second enabling circuit 437 similar to the second enabling circuit 235 of FIG. 2 and the second enabling circuit 335 of FIG. 3, and further including a transistor 432, is electrically connected to the output terminal of the sensitive circuit 230. In some embodiments, the transistor 432 is an N-type MOSFET. In some embodiments, the second enabling circuit 437 is electrically connected to the output terminal of the charge pump 331. In the second enabling circuit 437, a NAND gate 434 may be used instead of the AND gate 234, 334 used in the second enabling circuits 235, 335. Using the transistor 432, when the enable signal S3_1 and the POC enable signal S31 are both asserted (e.g., logic high), the NAND gate 434 outputs a low voltage to a gate electrode of the transistor 432 to turn off the transistor 432. When at least one of the enable signal S3_1 or the POC enable signal S31 is not asserted, the NAND gate 434 outputs a high voltage to the gate electrode of the transistor 432 to turn on the transistor 432. When the transistor 432 is turned on, output of the sensitive circuit 230 (e.g., output of the charge pump 331) is pulled to ground.

In some embodiments, at least one of the second enabling circuits 335, 435, or 437 is used in conjunction with, or as part of, the sensitive circuit 230 to achieve selective enabling or disabling of the sensitive circuit 230 in response to the POC enable signal S31. In some embodiments, the second enabling circuit 437 is electrically connected to the output terminal of the oscillator 320 (the drain terminals of the transistors 3232, 3233) to ground the output of the oscillator 320 when the POC enable signal S31 is not asserted. In some embodiments, the transistor 432 is a P-type MOSFET having a drain electrode electrically connected to the node 41, and a source electrode electrically connected to a voltage supply, such as the second voltage supply, which supplies the second voltage VDD2. Using an AND gate instead of the NAND gate 434, when the POC enable signal S31 is not asserted, the AND gate outputs low voltage to a gate electrode of the P-type MOSFET, which pulls up the voltage at the node 41 to about the second voltage VDD2, and disables the ring oscillator circuit.

Figure 5:
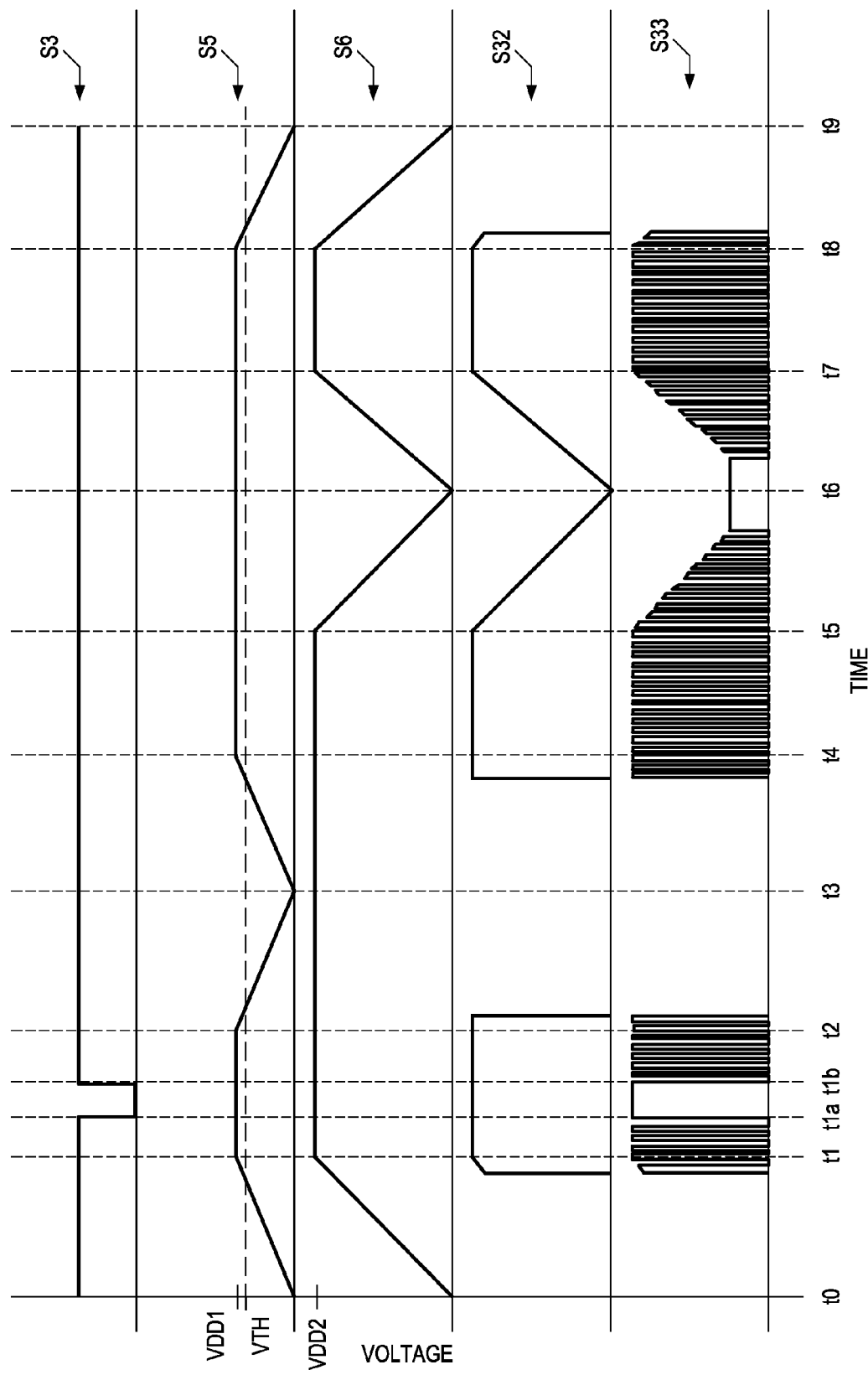
FIG. 5 is a graph showing waveforms of various signals during operation of the sensitive circuit of FIGS. 3 and 4 in accordance with various embodiments of the present disclosure.

FIG. 5 is a graph showing waveforms of various signals during operation of the sensitive circuit 230 of FIG. 3 and FIG. 4 in accordance with various embodiments of the present disclosure. The graph is an exemplary illustration of voltage levels of the enable signal S2, the bias signal S5, the second voltage supply S6, the ready signal S32, and the input signal S33 through various operating states of the sensitive circuit 230. FIG. 5 is associated with use of the second enabling circuit 335. Time t0 to t1 is associated with rising of both the bias signal S5 and the second voltage supply S6. Time t2 to t3 illustrates falling of the bias signal S5 with the second voltage supply S6 having the second voltage VDD2. Time t3 to t4 illustrates rising of the bias signal S5 with the second voltage supply S6 having the second voltage VDD2. Time t5 to t6 illustrates falling of the second voltage supply S6 with the bias signal S5 held at the first voltage VDD1. Time t6 to t7 illustrates rising of the second voltage supply S6 with the bias signal S5 held at the first voltage VDD1. Time t8 to t9 illustrates falling of both the bias signal S5 and the second voltage supply S6. Time t1a to t1b illustrates the input signal S33 when the enable signal S2 is de-asserted during a period (time t1 to t2) in which the bias signal S5 is held at the first voltage VDD1 and the second voltage supply S6 has the second voltage VDD2.

From time t0 to time t1, voltage level of the bias signal S5 rises toward the first voltage VDD1, and voltage level of the second voltage supply rises toward the second voltage VDD2. Prior to time t1, the second transistor 112 is turned on when the bias signal S5 crosses a threshold voltage VTH of the second transistor 112. The second transistor 112 pulls down the voltage at the node 31 to below the second threshold, and the Schmitt-trigger 113 outputs the logic low voltage to the inverter 333. The inverter 133 inverts the logic low voltage outputted by the Schmitt-trigger 113 to pull up the voltage level at the output of the inverter 133 toward the second voltage VDD2. The voltage level at the output of the inverter 133 tracks the rising of the second voltage supply prior to time t1. With the bias circuit 310 enabled by the enable signal S3, the oscillator 320 outputs the clock signal CLK to the AND gate 334. The input signal S33 to the charge pump 331 is driven by the clock signal CLK.

From time t2 to t3, the second supply voltage S6 has the second voltage VDD2, and the bias signal S5 exhibits a fall from the first voltage VDD1 to a low voltage (e.g., ground). As the voltage of the bias signal S5 falls, the second transistor 112 is turned off, and the voltage at the node 31 is pulled up by the first transistor 111 to about the second voltage VDD2. The Schmitt-trigger 113 transitions to output the logic high voltage (e.g., the second voltage VDD2) to the inverter 333, and the inverter 333 pulls down the ready signal S32 to the logic low voltage (e.g., ground). The logic low voltage inputted to the AND gate 334 holds the input signal S33 at the logic low voltage (e.g., ground), effectively disabling the charge pump 331.

From time t3 to t4, the bias signal S5 rises toward the first voltage VDD1 while the second voltage supply S6 has the second voltage VDD2. Prior to time t4, the second transistor 112 is turned on when the bias signal S5 crosses the threshold voltage VTH of the second transistor 112. The second transistor 112 pulls down the voltage at the node 31 to below the second threshold, and the Schmitt-trigger 113 outputs the logic low voltage to the inverter 333. The inverter 133 inverts the logic low voltage outputted by the Schmitt-trigger 113 to pull up the voltage level at the output of the inverter 133 to the second voltage VDD2.

From time t5 to time t6, the second voltage supply S6 falls from the second voltage VDD2 to the low voltage (e.g., ground). From time t6 to t7, the second voltage supply S6 rises from the low voltage to the second voltage VDD2. In both periods (t5 to t6, t6 to t7), the bias signal S5 has the first voltage VDD1, and keeps the second transistor 112 turned on to gate in the clock signal CLK to the charge pump 331 through the Schmitt-trigger 113, the inverter 333, and the AND gate 334, as described above. As a result, the input signal S33 is similar to the clock signal CLK (e.g., in frequency and amplitude). When the second voltage supply S6 is well below the second voltage VDD2 (e.g., near ground), peaks of the clock signal CLK may cease to register with the AND gate 334 as logic high impulses, so that the AND gate 334 may have a constant output until the second voltage supply S6 rises to a voltage level sufficiently high for the AND gate 334 to identify as a logic high level.

From time t8 to t9, the second voltage supply S6 falls from the second voltage VDD2 to the low level, and the bias signal S5 falls from the first voltage VDD1 to the low level. At a point in time between time t8 and time t9, the second transistor 112 turns off when the bias signal S5 falls to a voltage level below the threshold voltage VTH of the second transistor 112. As a result, the ready signal S32 is de-asserted through the Schmitt-trigger 113 and the inverter 333. Prior to the ready signal S32 being de-asserted, voltage level of the input signal S33 may track the voltage level of the second voltage supply S6.

From time t1 to t2, time t4 to t5, and time t7 to t8, the bias signal S5 has the first voltage VDD1 and the second voltage supply S6 has the second voltage VDD2. As a result, the input signal S33 is substantially similar to the clock signal CLK in both frequency and magnitude, and the charge pump 331 outputs the high voltage normally. From time t1a to t1b, with both the first voltage VDD1 and the second voltage supply S6 ready, the enable signal S3 is de-asserted (e.g., logic low, ground). As a result, generation of the clock signal CLK is stopped at the oscillator 320, and the charge pump 331 does not output the high voltage.

FIG. 6 is a flowchart showing a method 60 of operating an electronic device in accordance with various embodiments of the present disclosure. In some embodiments, the method 60 is used with the electronic device 20 or the sensitive circuit 230, and can be illustrated through the graph of FIG. 5. In step 600, a first enable signal associated with a biasing-sensitive circuit is received. In some embodiments, the first enable signal is the enable signal S3_1. In step 610, the first enable signal is directed to a power on control circuit to enable the power on control circuit (e.g., the power on control circuit 110). In step 620, a first voltage level of a first signal and a second voltage level of a second signal are detected by the POC circuit. In some embodiments, the first signal is the bias signal S5, and the second signal is the second voltage supply S6. In step 630, when the first voltage level is lower than a predetermined threshold, the biasing-sensitive circuit is disabled. In some embodiments, the predetermined threshold is the threshold voltage VTH of the second transistor 112. In some other embodiments, the predetermined threshold is a reference voltage biasing an input terminal of a comparator. The comparator may drive the gate electrode of the second transistor 112. In some embodiments, the biasing-sensitive circuit, such as the charge pump 331, is disabled through the Schmitt-trigger 113, the inverter 333, and the AND gate 334 in response to the first voltage level (e.g., the voltage level of the bias signal S5) being lower than the threshold voltage VTH of the second transistor 112. In step 640, when the first voltage level is above the predetermined threshold, the first enable signal is gated in to the biasing-sensitive circuit to enable the biasing-sensitive circuit. In some embodiments, step 640 corresponds to the second transistor 112 turning on when the bias signal S5 exceeds the threshold voltage VTH, the node 31 voltage being pulled down to the low voltage (e.g., ground), the Schmitt-trigger 113 outputting the low voltage, the inverter 333 inverting the low voltage to the logic high voltage, and the AND gate 334 gating in the clock signal CLK due to the logic high voltage of the ready signal S32 at the input terminal of the AND gate 334.

Figure 7:
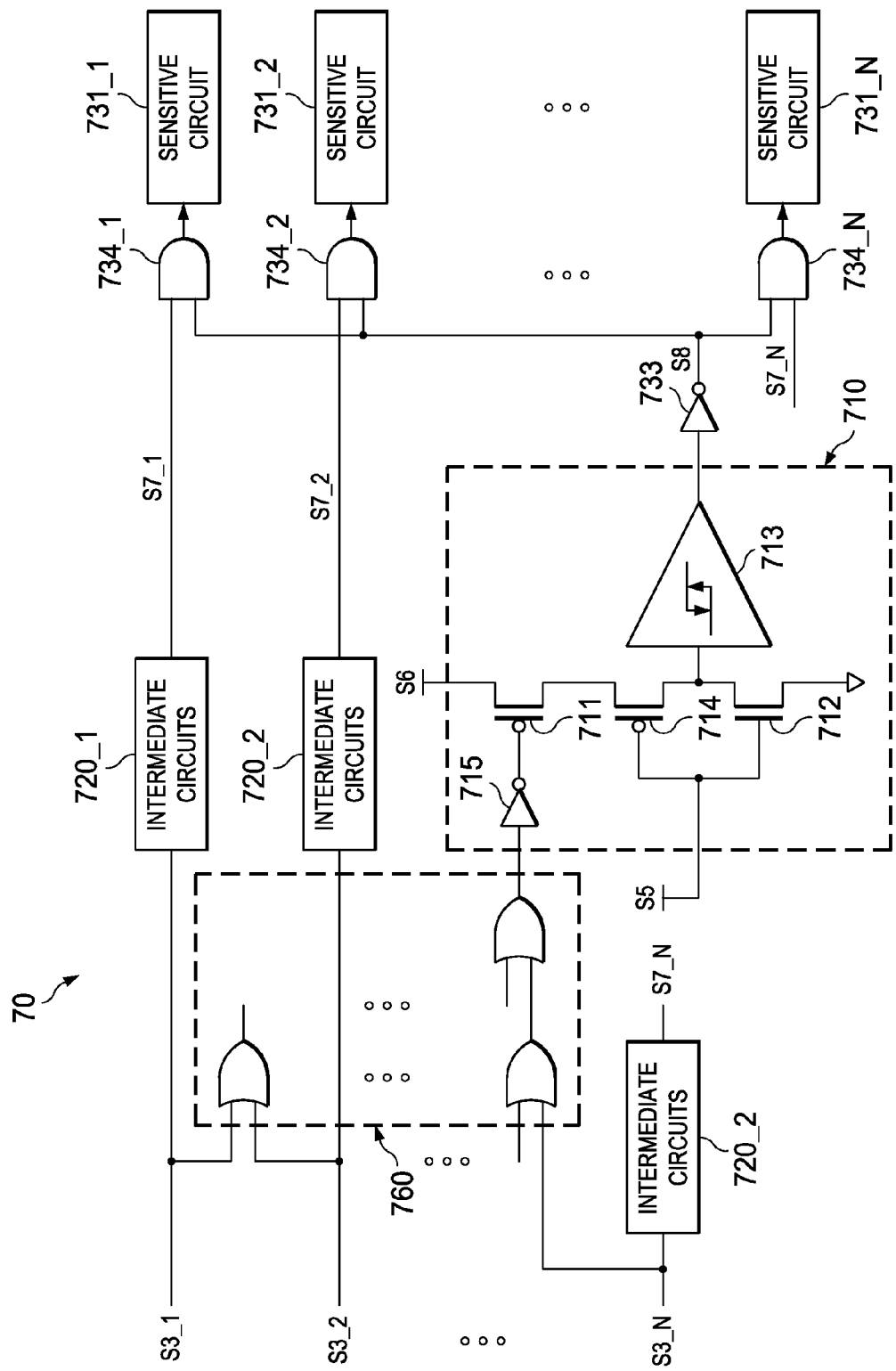
FIG. 7 is a circuit diagram of an electronic device in accordance with various embodiments of the present disclosure.

FIG. 7 is a circuit diagram of an electronic device 70 in accordance with various embodiments of the present disclosure. At least two biasing-sensitive circuits 731_1, 731_2, ..., 731_N are selectively enabled through at least two corresponding AND gates 734_1, 734_2, ..., 734_N. Each AND gate of the at least two AND gates 734_1, 734_2, ..., 734_N receives one of at least two corresponding enable signals S7_1, S7_2, ..., S7_N, and an inverted POC enable signal S8. The at least two enable signals S7_1, S7_2, ..., S7_N are generated by corresponding intermediate circuits 720_1, 720_2, ..., 720_N. In some embodiments, the intermediate circuits 720_1, 720_2, ..., 720_N are oscillators similar to the oscillator 320 of FIG. 3, and the enable signals S7_1, S7_2, ..., S7_N are clock signals similar to the clock signal CLK generated by the oscillator 320. The inverted POC enable signal S8 is generated by an inverter 733 electrically connected to an output terminal of a POC circuit 710. The intermediate circuits 720_1, 720_2, ..., 720_N are biased by corresponding bias signals S3_1, S3_2, ..., S3_N, which are generated by bias circuits similar to the bias circuit 310 of FIG. 3.

The bias signals S3_1, S3_2, ..., S3_N are received by an OR-type logic gate 760. In some embodiments, the OR-type logic gate 760 is an OR gate. In some embodiments, the OR-type logic gate 760 is a NOR gate. In some embodiments, the OR-type logic gate 760 receives all of the bias signals S3_1, S3_2, ..., S3_N. In some embodiments, the OR-type logic gate 760 receives some of the bias signals S3_1, S3_2, ..., S3_N. The OR-type logic gate 760 outputs a logic high voltage (e.g., 5.5 Volts) when any one of the bias signals S3_1, S3_2, ..., S3_N is asserted. In some embodiments, the OR-type logic gate 760 includes a plurality of dual-input-single-output OR gates, which combine to form an N-input-single-output OR gate, as shown in FIG. 7. N is a positive integer.

The logic high voltage outputted by the OR-type logic gate 760 is inverted by an inverter 715, which outputs a logic low voltage to a gate electrode of a first transistor 711. The logic low voltage turns on the first transistor 711 when a high voltage (e.g., the second voltage VDD2 provided by a second voltage supply S6) is present at a source electrode of the first transistor 711. The high voltage is transferred to a source electrode of a third transistor 714. In some embodiments, the third transistor 714 is a PMOS transistor. When a bias signal S5 is low (e.g., ground), the third transistor 714 is turned on, and the high voltage is transferred to an input terminal of a Schmitt-trigger 713. When the bias signal S5 is high (e.g., at the first voltage VDD1), a second transistor 712 is turned on to pull down voltage at the input terminal of the Schmitt-trigger 713 (e.g., to ground). Similar to the Schmitt-trigger 113 described above, the Schmitt-trigger 713 outputs a high voltage when the voltage at the input terminal of the Schmitt-trigger 713 is higher than a first threshold, and outputs a low voltage when the voltage at the input terminal of the Schmitt-trigger 713 is lower than a second threshold.

In some embodiments, such as shown in FIG. 7, the POC circuit 710 is shared among all of the various bias signals S3_1, S3_2, . . . , S3_N. In some embodiments, the POC circuit 710 is shared among some of the various bias signals S3_1, S3_2, . . . , S3_N. In some embodiments, multiple POC circuits like the POC circuit 710 are used to control various groups of the AND gates 734_1, 734_2, . . . , 734_N for enabling the biasing-sensitive circuits 731_1, 731_2, . . . , 731_N in corresponding groups. In some embodiments, one POC circuit such as the POC circuit 710 corresponds to each one of the bias signals S3_1, S3_2, . . . , S3_N, each one of the intermediate circuits 720_1, 720_2, . . . , 720_N, each one of the AND circuits 734_1, 734_2, . . . , 734_N, and each one of the biasing-sensitive circuits 731_1, 731_2, . . . , 731_N. It should be appreciated that the POC circuit 110 could also use the three-transistor configuration shown in FIG. 7.

FIG. 8 is a flowchart showing a method 80 of operating an electronic device, such as the electronic device 70, the electronic device 20 or the sensitive circuit 230, in accordance with various embodiments of the present disclosure. In step 800, a first enable signal associated with a biasing-sensitive circuit of a plurality of biasing-sensitive circuits is received. Taking the biasing-sensitive circuit 731_1 as an illustrative example, the enable signal S3_1 associated with the biasing-sensitive circuit 731_1 is received as the first enable signal of Step 800. In step 810, a power on control circuit is enabled by the first enable signal. For example, the enable signal S3_1 enables the POC circuit 710 through the OR gate 760 and the inverter 715. In some embodiments, the enable signal S3_1 directly enables the POC circuit 710. In step 820, while the power on control circuit is enabled, a first voltage level of a first signal and a second voltage level of a second signal are detected. In the example of FIG. 7, voltage level of the bias signal S5 and voltage level of the second voltage supply S6 are detected by the POC circuit 710 through the first transistor 711, the second transistor 712, the third transistor 714, and the Schmitt-trigger 713. In step 830, the plurality of biasing-sensitive circuits are disabled when the first voltage level is below a predetermined threshold. For example, when the bias signal S5 has voltage lower than a threshold voltage VTH of the second transistor 712, the second transistor 712 is not turned on, and the input terminal of the Schmitt-trigger 713 has voltage pulled up by the second voltage supply S6 (e.g., 5.5 Volts). As a result, the inverter 733 outputs the logic low voltage (e.g., ground) to corresponding input terminals of the AND gates 734_1, 734_2, . . . , 734_N, which causes the AND gates 734_1, 734_2, . . . , 734_N to output the logic low voltage, disabling the biasing-sensitive circuits 731_1, 731_2, . . . , 731_N. In step 840, when the first voltage level is above the predetermined threshold, a second enable signal(s) is gated in to the plurality of biasing-sensitive circuits. In some embodiments, the second enable signal is the first enable signal. In some embodiments, the second enable signal is a signal generated from or in response to the first enable signal. For example, the enable signal S3_1 in FIG. 2 represents the first enable signal and the second enable signal. As another example, the enable signal S3_1 in FIG. 3 represents the first enable signal, and the clock signal CLK represents the second enable signal. As a further example, in FIG. 7, the enable signal S2_1 represents the first enable signal, and the enable signal S7_1 represents the second enable signal. When the voltage of the bias signal S5 is above the threshold voltage VTH of the second transistor 712, the enable signal S7_1 is gated in to the biasing-sensitive circuit 731_1 through action of the second transistor 712 pulling down the voltage at the input terminal of the Schmitt-trigger 713, the Schmitt-trigger 713 outputting the logic low voltage to the inverter 733, and the inverter 733 outputting the logic high voltage to the AND gate 734_1. Other enable signals S7_2, . . . , S7_N may also be gated in to respective biasing-sensitive circuits 731_2, . . . , 731_N through corresponding AND gates 734_2, . . . , 734_N.

Embodiments may achieve advantages over existing electrical circuits that operate in multiple power domains. In some situations, the bias signal S5 (e.g., voltage level of the first voltage supply) is not at a level (e.g., the first voltage VDD1) high enough to support normal and accurate operation of circuits in an electronic device that are powered by the bias signal S5. Errors occur if biasing-sensitive circuits are biased by the second voltage supply and the bias signal S5 while the bias signal S5 is still rising to the first voltage VDD1. The electronic devices 20, 30, and 70 mitigate such errors by disabling the biasing-sensitive circuits (e.g., the biasing-sensitive circuits 231, 331, or 731_1-731_N) until the bias signal S5 is high enough to ensure proper operation of the circuits in the electronic devices 20, 30, or 70 that are powered by the bias signal S5. The disabling is accomplished by the POC circuits 110, 710 and the AND gates 234, 334, 734_1-734_N.

Circuits are typically powered and/or biased by multiple voltages. The multiple voltages set up potential differences that allow electrical currents to flow throughout the circuit to perform various functions. Typically, electrical currents are defined as flowing from high voltage to low voltage. Voltage sources in circuits are also often defined in terms of a supply voltage and ground, with ground representing 0 Volts. Other definitions are sometimes given in terms of an upper supply voltage (VDD, VCC), and a lower supply voltage (VSS, VEE). Thus, a circuit that operates on a 1.8 Volt supply may be defined as having an upper bias of 0.9 Volts, and a lower bias of −0.9 Volts. In the following description, the term "ground" should be interpreted as including low supply voltage, such as the −0.9 Volts in the previous example, unless specifically referred to as "earth ground," or the like. Voltage levels, being relative, are not then intended so much to limit the scope of the disclosure, but more as a point of reference for convenient illustration.

Metal-oxide-semiconductor (MOS) transistors are typically described in terms of four transistor terminals: a gate, a source, a drain, and a bulk. It should be appreciated that most MOS transistors are symmetrical devices, such that the source and the drain thereof are interchangeable, and the terms "source" and "drain" often represent nomenclature for convenience of discussion. Terminals of MOS transistors may also be referred to as "electrodes," "ends," and the like, without any distinction intended through use of these different names. Biasing of such terminals is usually performed through direct or indirect contact between a direct current (DC) voltage source and the terminal being biased. The contact may be through metallization layers, contact vias, pads, bumps, and/or similar interconnect structures formed on and over device regions of the MOS transistors.

In accordance with various embodiments of the present disclosure, an electronic device includes a first circuit, a second circuit, and a power on control (POC) circuit. The POC circuit includes an enable terminal electrically connected to a first output of the first circuit, a first input terminal electrically connected to a first voltage supply, a second input terminal electrically connected to a second voltage supply, and an output terminal. The second circuit includes a biasing-sensitive circuit, and a logic circuit including a first input terminal electrically connected to a second output of the first circuit, a second input terminal electrically connected to the output of the POC circuit, and an output terminal electrically connected to an enable terminal of the biasing-sensitive circuit.

In accordance with various embodiments of the present disclosure, a method of operating an electronic device includes receiving a first enable signal associated with a circuit of the electronic device; enabling a power on control (POC) circuit by the first enable signal; detecting a first voltage level of a first signal and a second voltage level of a second signal by the power on control circuit while the first enable signal is asserted; and disabling the circuit when the first voltage level is below a predetermined threshold.

In accordance with various embodiments of the present disclosure, a method of operating an electronic circuit includes receiving a first enable signal associated with a first circuit of a plurality of circuits; enabling a power on control (POC) circuit by the first enable signal; detecting a first voltage level of a first signal and a second voltage level of a second signal by the POC circuit; and disabling the plurality of circuits when the first voltage level is below a predetermined threshold.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device comprising:
   a first circuit;
   a power on control (POC) circuit comprising:
      an enable terminal electrically connected to a first output of the first circuit;
      a first input terminal electrically connected to a first voltage supply;
      a second input terminal electrically connected to a second voltage supply; and
      an output terminal; and
   a second circuit comprising:
      a biasing-sensitive circuit; and
      a logic circuit comprising:
         a first input terminal electrically connected to a second output of the first circuit;
         a second input terminal electrically connected to the output of the POC circuit; and
         an output terminal electrically connected to an enable terminal of the biasing-sensitive circuit.

2. The electronic device of claim 1, wherein the logic circuit is an AND gate.

3. The electronic device of claim 1, wherein the POC circuit comprises:
   a first transistor comprising:
      a gate electrode electrically connected to the output of the first circuit;
      a source electrode electrically connected to the second voltage supply; and
      a drain electrode;
   a second transistor comprising:
      a gate electrode electrically connected to the first voltage supply;
      a source electrode electrically connected to a third voltage supply; and
      a drain electrode electrically connected to the drain electrode of the first transistor; and
   a comparator comprising:
      an input terminal electrically connected to the drain electrodes; and
      an output terminal electrically connected to the second input terminal of the logic circuit.

4. The electronic device of claim 3, wherein the comparator is a Schmitt-trigger.

5. The electronic device of claim 1, wherein the POC circuit comprises:
   an inverter comprising:
      an input terminal electrically connected to the output of the first circuit; and
      an output terminal;
   a first transistor comprising:
      a gate electrode electrically connected to the output terminal of the inverter;
      a source electrode electrically connected to the second voltage supply; and
      a drain electrode;
   a second transistor comprising:
      a gate electrode electrically connected to the first voltage supply;
      a source electrode electrically connected to a third voltage supply; and
      a drain electrode;
   a third transistor comprising:
      a gate electrode electrically connected to the first voltage supply;
      a source electrode electrically connected to the drain electrode of the first transistor; and
      a drain electrode electrically connected to the drain electrode of the second transistor; and
   a comparator comprising:
      an input terminal electrically connected to the drain electrodes of the second and third transistors; and
      an output terminal electrically connected to the second input terminal of the logic circuit.

6. The electronic device of claim 5, wherein the comparator is a Schmitt-trigger.

7. The electronic device of claim 1, wherein the first circuit comprises a bias circuit and an oscillator, the first output is an output terminal of the bias circuit, and the second output is an output terminal of the oscillator.

8. A method of operating an electronic device, the method comprising:
   receiving a first enable signal associated with a circuit of the electronic device;
   enabling a power on control (POC) circuit by the first enable signal;
   detecting a first voltage level of a first signal and a second voltage level of a second signal by the POC circuit while the first enable signal is asserted;
   gating in a second enable signal associated with the first enable signal to the circuit when the first voltage level is above a predetermined threshold, the step of gating in comprises:
      receiving the second enable signal at a first input terminal of a logic circuit;
      receiving a third enable signal from the POC circuit at a second input terminal of the logic circuit; and
      outputting the second enable signal to the circuit by an output terminal of the logic circuit;
   and
   disabling the circuit when the first voltage level is below the predetermined threshold.

9. The method of claim 8, wherein the logic circuit comprises:
   an AND gate.

10. The method of claim 9, wherein the second enable signal is a clock signal generated by an oscillator of the electronic device.

11. The method of claim 9, wherein step of detecting comprises:
   detecting the first voltage level of a first voltage supply; and
   detecting the second voltage level of a second voltage supply.

12. The method of claim 11, wherein:
the POC circuit comprises:
   a first transistor comprising:
      a gate electrode electrically connected to an output of the circuit; and
      a source electrode electrically connected to the second voltage supply;
   a second transistor comprising:
      a gate electrode electrically connected to the first voltage supply;
      a source electrode electrically connected to a third voltage supply; and
      a drain electrode electrically connected to a drain electrode of the first transistor;
and
   a comparator comprising:
      an input terminal electrically connected to the drain electrodes; and
      an output terminal electrically connected to the second input terminal of the AND gate; and wherein the step of gating in further comprises turning on the second transistor when the first voltage level is above a threshold voltage of the second transistor.

13. The method of claim 12, wherein the comparator is a Schmitt-trigger, and the step of gating in further comprises:
   outputting voltage level of the third voltage supply from the Schmitt-trigger to an inverter electrically connected to the second input terminal of the AND gate.

14. The method of claim 8, wherein the logic circuit is built using logic gates selected from a group comprising logic AND gates, logic NAND gates, inverters, logic OR gates, logic NOR gates, logic XOR gates, logic XNOR gates, and combinations thereof.

15. A method of operating an electronic circuit, the method comprising:
   receiving a first enable signal associated with a first circuit of a plurality of circuits;
   enabling a power on control (POC) circuit by the first enable signal;
   detecting a first voltage level of a first signal and a second voltage level of a second signal by the POC circuit;
   gating in at least one second enable signal to at least one second circuit of the plurality of circuits when the first voltage level is above a predetermined threshold, the step of gating in comprises:
      pulling down voltage of an input terminal of a comparator;
      outputting a logic low voltage by the comparator;
      inverting the logic low voltage to generate a logic high voltage; and
      receiving the logic high voltage at a second input terminal of at least one logic circuit that has a first input terminal receiving the at least one second enable signal; and
   disabling the plurality of circuits when the first voltage level is below the predetermined threshold.

16. The method of claim 15, wherein the step of gating in comprises:
   receiving the first enable signal and the second signal at a first transistor of the POC circuit;
   receiving the first signal at a second transistor and a third transistor of the POC circuit; and
   turning on the second transistor and reducing current flow through the third transistor when the first voltage level is above a threshold voltage of the second transistor.

17. The method of claim 15, wherein the comparator is a Schmitt-trigger; and
   the at least one logic circuit is an AND gate.

18. The method of claim 15, wherein the step of gating in comprises:
   gating in a clock signal generated by an oscillator enabled by the first enable signal to a charge pump when the first voltage level is above the predetermined threshold.

19. The method of claim 18, wherein the step of receiving the first enable signal comprises:
   receiving the first enable signal from a bias circuit.

20. The method of claim 15, wherein the at least one logic circuit is built using logic gates selected from a group comprising logic AND gates, logic NAND gates, inverters, logic OR gates, logic NOR gates, logic XOR gates, logic XNOR gates, and combinations thereof.

* * * * *